United States Patent [19]
Tran

[11] Patent Number: 5,619,464
[45] Date of Patent: Apr. 8, 1997

[54] HIGH PERFORMANCE RAM ARRAY CIRCUIT EMPLOYING SELF-TIME CLOCK GENERATOR FOR ENABLING ARRAY ACCESSESS

[75] Inventor: Thang M. Tran, Austin, Tex.

[73] Assignee: Advanced Micro Devices, Inc., Sunnyvale, Calif.

[21] Appl. No.: 473,103

[22] Filed: Jun. 7, 1995

[51] Int. Cl.⁶ ............................................. G11C 13/00
[52] U.S. Cl. ............................................ 365/203; 365/233
[58] Field of Search ............................... 365/194, 203, 365/233, 109.11, 230.08, 200

[56] References Cited

U.S. PATENT DOCUMENTS 5,270,975  12/1993  McAdams .......................... 365/200

Primary Examiner—Terrell W. Fears
Attorney, Agent, or Firm—Conley, Rose & Tayon, P.C.; B. Noel Kivlin

[57] ABSTRACT

A RAM array circuit is provided which includes a memory array formed by several RAM cell columns. A particular cell within each column and row may be selected for access (either read or write) by an address decode circuit. The RAM array circuit employs a self-time column having a delay characteristic which is approximately equal to that of each of the RAM cell columns. The rising edge of a single-phase clock is used to precharge each RAM cell column as well as the self-time column. As the self-time column is precharged to a high level, the self-time control circuit disables the precharge and enables the array access for read or write. When a particular row is selected by the address decoding mechanism, the self-time column is discharged. Once the self-time column has discharged, a sense amplifier is enabled to read data from the array. Access is then disabled and precharge is again enabled upon the next rising edge of the clock.

20 Claims, 2 Drawing Sheets

HIGH PERFORMANCE RAM ARRAY CIRCUIT EMPLOYING SELF-TIME CLOCK GENERATOR FOR ENABLING ARRAY ACCESSESS

BACKGROUND OF THE INVENTION

1. Field of the Invention

This invention relates to random access memory arrays and more particularly to a high performance random access memory array circuit employing a self-time clock circuit to allow operation from a single phase clock signal.

2. Description of the Relevant Art

Random access memory (RAM) arrays are employed within a variety of digital systems to provide data storage. A static RAM stores bits in an array of flip-flops, whereas a dynamic RAM stores bits as charged capacitors. A bit once written in a static RAM stays there until rewritten, unless the power is turned off. In a dynamic RAM the data will disappear due to discharge, unless "refreshed".

A typical static RAM circuit includes an array of RAM cells including a predetermined arrangment of columns and rows. Upon each cycle, a row is enabled to allow the reading of a selected cell through a differential sense amplifier. In a typical static RAM array, a two-phase clock is employed wherein a first phase of the clock initiates the precharge of each RAM cell column, while the second phase of the clock enables the row address decoder and the sense amplifier.

As the speeds of microprocessors and other digital circuits are increased, a RAM array within such circuits must be capable of performing data storage and retrieval at higher frequencies. Unfortunately, as frequencies increase, it becomes more and more difficult to generate a stable two-phase clock. In addition, since each individual array has different timing requirements, the global two-phase clocks are used inefficiently with respect to accessing the RAM array.

It is therefore desirable to provide a high performance RAM array circuit configured to operate at high frequencies using a single-phase clock.

SUMMARY OF THE INVENTION

The problems outlined above are in large part solved by a high performance random access memory (RAM) array circuit including a self-time control circuit in accordance with the present invention. In one embodiment, a RAM array circuit is provided which includes a memory array formed by several RAM cell columns. A particular cell within each column and row may be selected for access (either read or write) by an address decode circuit. The RAM array circuit advantageously employs a self-time column having a delay characteristic which is approximately equal to that of each of the RAM cell columns. The rising edge of a single-phase clock is used to precharge each RAM cell column as well as the self-time column. As the self-time column is precharged to a high level, the self-time control circuit disables the precharge and enables the array access for read or write. When a particular row is selected by the address decoding mechanism, the self-time column is discharged. Once the self-time column has discharged, a sense amplifier is enabled to read data from the array. Access is then disabled and precharge is again enabled upon the next rising edge of the clock.

The RAM array circuit of the present invention advantageously provides self-timing for accessing the RAM array, thus allowing arrays of different sizes to each operate at their optimal levels. The timing of array accesses is further scalable to different process technologies. The RAM array circuit is further operable within digital environments driven by single-phase clocks.

Broadly speaking, the present invention contemplates a random access memory array circuit comprising a RAM cell column including a plurality of RAM cells and an address decode circuit coupled to the RAM cell column. The address decode circuit is configured to receive an address signal and to select one of the RAM cells depending upon the address signal. A precharge circuit is coupled to the RAM cell column for precharging the plurality of RAM cells. The precharge circuit is configured to precharge the plurality of the RAM cells in response to a clock signal. A self-time column is further provided having a delay approximately equal to a delay of the RAM cell column, wherein the self-time column is configured to generate a self-time signal indicative of a charged or discharged state of the self-time column. A self-time control circuit is coupled to self-time column and to the precharge circuit. The self-time control circuit is configured to enable an access of the RAM cell column in response to the self-time signal.

The invention further contemplates a random access memory array circuit comprising a RAM cell column including a plurality of RAM cells and an address decode circuit coupled to the RAM cell column. The address decode circuit is configured to receive an address signal and to select one of the RAM cells depending upon the address signal. A precharge circuit is coupled to the RAM cell column for precharging the plurality of RAM cells. The precharge circuit is configured to precharge the plurality of the RAM cells in response to a clock signal. A self-time column is further provided having a delay approximately equal to a delay of the RAM cell column, wherein the self-time column is configured to generate a self-time signal indicative of a charged or discharged state of the self-time column. A self-time control circuit is coupled to self-time column and to the precharge circuit. The self-time control circuit is configured to enable the address decode circuit to select a RAM cell in response to the self-time signal indicating the charged state of the self-time column.

BRIEF DESCRIPTION OF THE DRAWINGS

Other objects and advantages of the invention will become apparent upon reading the following detailed description and upon reference to the accompanying drawings in which.

Figure 1:
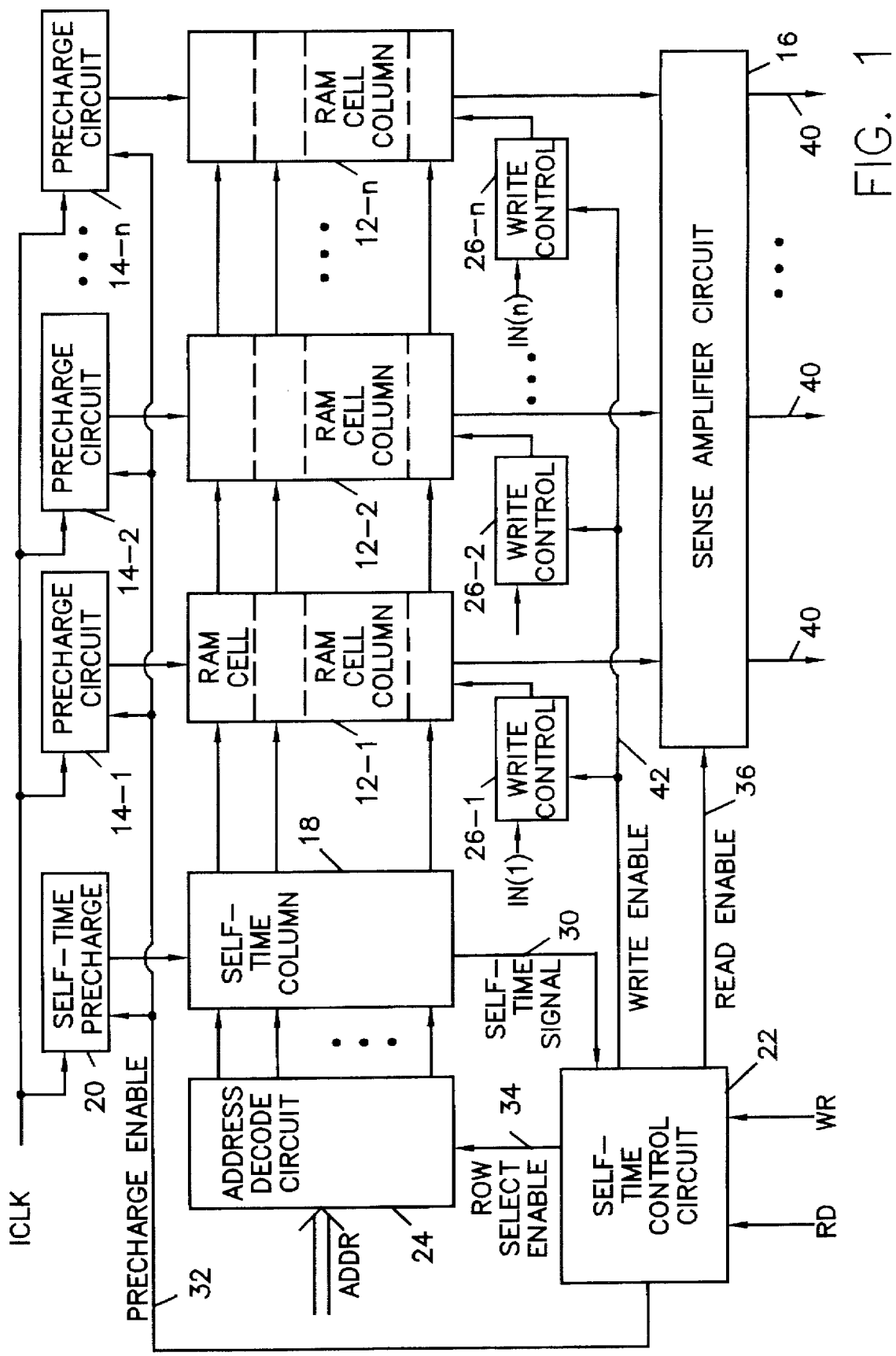
FIG. 1 is a block diagram of a random access memory array circuit including a self-time control circuit in accordance with one embodiment of the present invention.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE INVENTION

Referring now to the drawings, FIG. 1 is a block diagram of a RAM array circuit in accordance with one embodiment of the present invention. The RAM array circuit includes a plurality of RAM cell columns 12-1 through 12-n coupled to precharge circuits 14-1 through 14-n and to a sense amplifier circuit 16. RAM cell columns 12-1 through 12-n are referred to collectively as RAM cell columns 12, and precharged circuits 14-1 through 14-n are referred to collectively as precharge circuits 14. Each RAM cell column includes a plurality of individual RAM cells, each configured to store a bit of data. The RAM array circuit further includes a self-time column 18 configured with a delay which is approximately equal to that of each of the RAM cell columns 12. A self-time precharge circuit 20 and a self-time control circuit 22 are further shown coupled to self-time column 18. An address decode circuit 24 and a plurality of write control circuits 26-1 through 26-n are finally shown coupled to RAM cell columns 12.

Precharge circuits 14 are provided to precharge the respective RAM cell columns 12 in response to a rising edge of single-phase clock signal ICLK. Self-time precharge circuit 20 is similarly configured to precharge self-time column 18 upon the rising edge of the clock signal ICLK. An output signal from the self-time column 18 labeled self-time signal is indicative of a charged or discharge state of the self-time column 18.

During operation of the RAM array circuit of FIG. 1, when RAM array cell columns 12 and self-time column 18 are precharged in response to a rising edge of clock signal ICLK, the self-time signal from self-time column 18 indicates a charged-state of the self-time column 18 (i.e., the self-time signal goes high). The self-time control circuit 22 responsively deasserts a precharge enable signal at line 32 to cause precharge circuits 14 and self-time precharge circuit 20 to discontinue the precharging of RAM cell columns 12 and self-time column 18, respectively. The self-time control circuit 22 also asserts a row select enable signal at line 34 which allows address decode circuit 24 to select an addressed row of the RAM cell columns 12. This thus allows access to a particular row of the RAM array after precharge has been effectuated.

At the same time a row is selected by address decode circuit 24, self-time column 18 is discharged. As the self-time column 18 discharges, the self-time signal at line 30 goes low and indicates a discharged state. Self-time control circuit responsively asserts a read enable signal at line 36 if a read control signal RD is also asserted. Assertion of the read enable signal at line 36 enables sense amplifier circuit 16 to cause the storage states of the selected RAM cells to be driven at output lines 40. It is thus noted that the same amplifier circuit 16 is not turned on until after the self-time column 18 has discharged.

The self-time control circuit is further configured to assert a write enable signal at a line 42 after precharge circuits 14 have been turned off (i.e., after self-time control circuit 22 detects the charged-state of the self-time signal at line 30) if a write control signal WR is asserted. Assertion of the write enable signal at line 42 enables write control circuits 26 to write the input data IN into the selected row of RAM cell columns 12. It is noted that at the same time the write enable signal at line 42 is asserted, a row select signal from address decode circuit 24 is also asserted to select the row to be written.

After the row selection through address decode circuit 24 occurs and the read or write access has been effectuated, the row selection and array access is disabled. The precharge enable signal at line 32 is again asserted by self-time control circuit 22 to allow precharge circuits 14 and self-time precharge circuit 20 to precharge RAM cell columns 12 and self-time column 18, respectively, upon the next rising edge of the clock signal ICLK.

In accordance with the RAM array circuit of FIG. 1 including self-time control circuit 22 and self-time column 18, a single-phase clock signal ICLK may be employed and high performance may be attained. Rather than using a first clock phase to control column precharge and a second clock phase to enable array accesses, the self-time control circuit 22 and self-time column 18 dynamically control the enablement of read or write accesses depending upon the delay of the self-time column, which is representative of the delay of each of the RAM cell columns. Accesses are further prevented while the precharge occurs, and the self-time control circuit 22 automatically turns off the precharge after charging of the self-time column has been effectuated. As a result, access times of the RAM array cell may be advantageously reduced.

Figure 2:
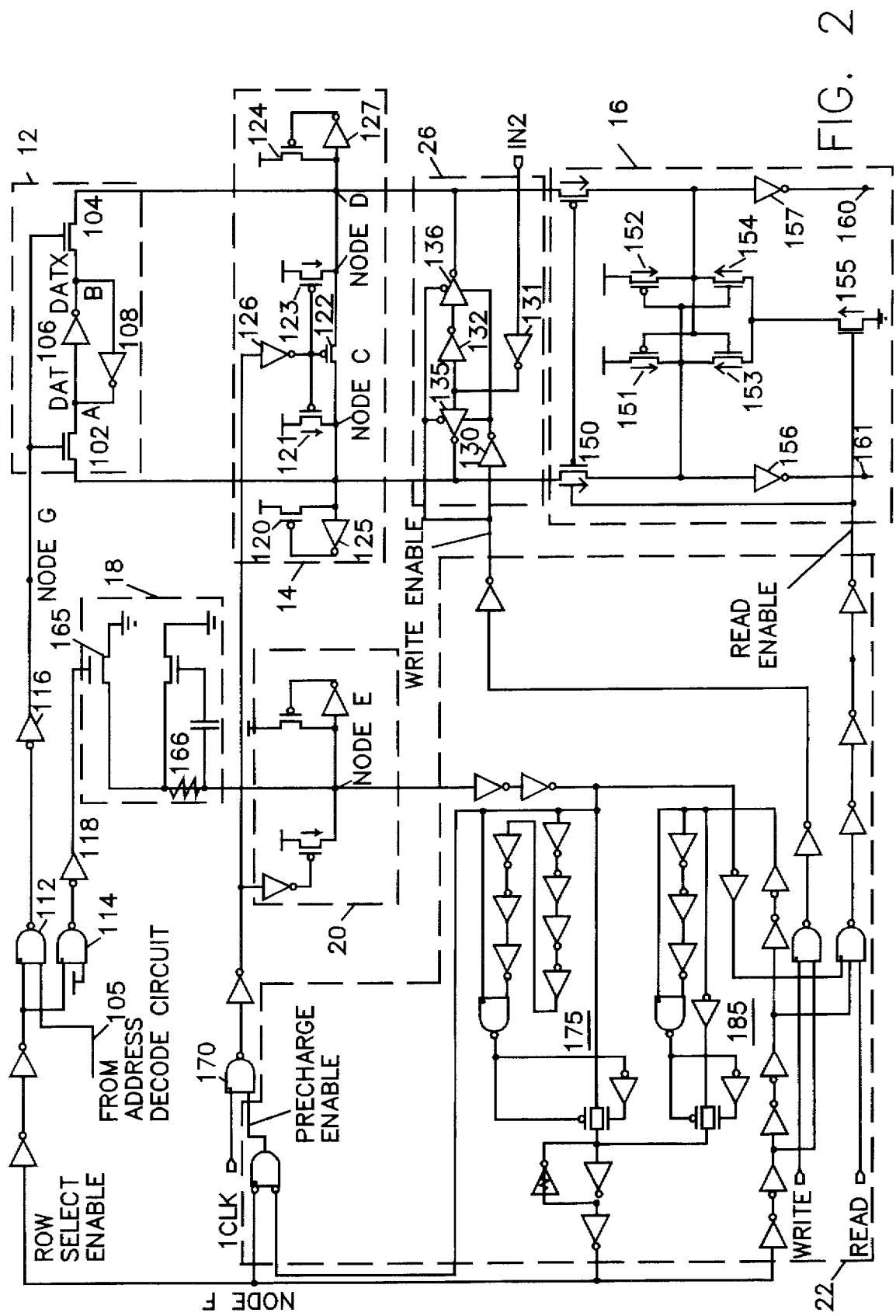
FIG. 2 is a schematic diagram that illustrates a circuit implementation of a RAM array circuit in accordance with the present invention.

Turning next to FIG. 2, a schematic diagram is shown of portions of one implementation of the RAM array circuit of FIG. 1. Circuit portions that correspond to those of FIG. 1 are numbered identically for simplicity and clarity.

FIG. 2 illustrates an exemplary RAM column 12 including a plurality of RAM cells, a representative one of which includes FETs 102 and 104 and inverters 106 and 108. It is noted that the illustrated RAM cell is configured to store a bit of data at a node A along with its complement at node B. The RAM cell may be selected by a select signal at line 105 originating from a portion of the address decode circuit 24 (of FIG. 1). It is noted that a plurality of additional RAM cells are coupled in parallel with the illustrated RAM cell within the RAM column, and that each cell within a given column may be selected by a separate select signal from address decode circuit 24. Nand gates 112 and 114 as well as inverters 116 and 118 collectively form a portion of address decode circuit 24. Additional circuitry forming address decode circuit 24 for providing the address decode function is omitted from the schematic of FIG. 2 for simplicity.

A precharge circuit 14 is coupled to RAM column 12 for precharging the column 12. Precharge circuit 14 includes FETs 120–124 and inverters 125–127. It is noted that when line 128 is driven high, FETs 121–123 turn on and precharge nodes C and D. FETs 120 and 124 operate as weak pull-up devices to maintain nodes C and D high unless driven low by other elements. Self-time precharge circuit 20 is configured to precharge node E in a manner similar to that effectuated by precharge circuit 14.

A write enable circuit 26 as well as a portion of sense amplifier circuit 16 are also shown coupled to RAM cell column 12. Write enable circuit 26 includes inverters 130–132 and tri-state inverters 135 and 136. It is noted that when the write enable signal is asserted low, inverters 135 and 136 turn on, thus causing input data IN to be driven at node D and its complement to be driven at node C.

FIG. 2 also illustrates a portion of sense amplifier circuit 16 which provides output from RAM column 12. The circuit includes FETs 150–155 and inverters 156 and 157. When the read enable signal is asserted high, sense amplifier 16 turns on, and the differential voltage between nodes C and D is detected. A corresponding output signal along with its complement are provided at lines 160 and 161, respectively.

The self-time column 18 includes an FET 165 and delay element 166. FET 165, when turned on, causes node E to discharge. The self-time column 18 is configured such that the overall delay at node E is approximately the same as that introduced by RAM cell column 12 at, for example, node C or node D. It is also noted that delay element 166 could be implemented using a variety of specific physical structures.

The operation of the RAM array circuit of FIG. 2 including self-time control circuit 22 will next be described. Upon a rising edge of the clock signal ICLK, the output of nand gate 170 goes low (assuming the precharge enable signal is asserted high and the row select enable is deasserted low). This causes self-time precharge circuit to turn on and thus node E to be precharged high. Similarly, precharge circuit 14 turns on, thus causing nodes C and D to also be precharged high. Within a few gate delays later, the high voltage level at node E is latched at node F via latch circuit 175. This causes the precharge enable signal to be deasserted low which respondingly causes the output of nand gate 170 to go high. Accordingly, precharge circuit 14 and self-time precharge circuit 20 are turned off. At approximately the same time, the row select enable signal is also asserted high, thus allowing row selection through address decode circuit 24. For the RAM cell shown in FIG. 2, row selection is effectuated through nand gate 112. When node G is driven high, FETs 102 and 104 turn on, thus allowing inverters 106 and 108 to drive nodes D and C, respectively. Assertion of the row select enable signal also causes the output of nand gate 114 to go low, thus turning on FET 165 which, as stated previously, causes node E to discharge. Within a few gate delays of node E discharging, and if the read signal is asserted high, the output of nand gate 180 goes low, thus causing the read enable signal to go high. As stated previously, this turns on sense amplifier 116 to thereby allow reading of the data stored within the selected cell of RAM cell column 12. Latch circuit 185 subsequently causes node F to go low, thus also causing the row select signal to be deasserted low, and causing the read enable signal to be deasserted high. The precharge enable is similarly asserted high to enable precharge upon the next rising edge of the clock signal ICLK.

It is noted that the write enable signal may similarly be enabled to allow a write operation for the selected RAM cell to occur if the write signal is asserted high. Such a write operation is effectuated several gate delays after node E is precharged.

The RAM array circuit of FIG. 2 allows high performance data storage using a single phase clock. Rather than using a first clock face to control column precharge and a second clock phase to enable array accesses (i.e., row selection and read/write enablement), the self-time control circuit 22 and self-time column 18 dynamically control the enablement of read/write accesses and of row selection depending upon the delay of the self-time column. The accesses are further prevented while the precharge occurs, and the self-time control circuit 22 automatically turns off the precharge after charging the self-time column has been effectuated. As a result, access times of the RAM array cell may be advantageously reduced.

Numerous variations and modifications will become apparent to those skilled in the art once the above disclosure is fully appreciated. For example, it is noted that in an alternative configuration, the RAM array circuit is configured to invoke column precharge upon falling edges of the clock signal ICLK, rather than upon rising edges.

In addition, the self-time column may further be implemented within a dual-ported RAM array wherein, for example, precharge for the secondary port occurs when the primary port is being accessed and wherein accesses of the secondary port are enabled when the primary port is precharging. For such a dual-ported configuration, the secondary port may be write-only to maintain proper self-timing.

Similarly, variations in the circuitry used to implement the various sections of the RAM array circuit, such as the circuitry forming self-time control circuit 22, are possible. Furthermore, while it is preferable that the delay of self-time column 18 be within 0–2% of the delay of a representative RAM cell column, such delay is considered to be approximately equal to the delay of a RAM cell column if it is within a 10% variance. The delay of the self-time column may be adjustable by software or metal mask option. It is intended that the following claims be interpreted to embrace all such variations and modifications.

What is claimed is:

1. A random access memory array circuit comprising:

a RAM cell column including a plurality of RAM cells;

an address decode circuit coupled to said RAM cell column, wherein said address decode circuit is configured to receive an address signal and to select one of said plurality of RAM cells depending upon said address signal;

a precharge circuit coupled to said RAM cell column for precharging said plurality of RAM cells, wherein said precharge circuit is configured to precharge said plurality of said RAM cells in response to a clock signal;

a self-time column having a delay approximately equal to a delay of said RAM cell column, wherein said self-time column is configured to generate a self-time signal indicative of a charged or discharged state of said self-time column; and a self-time control circuit coupled to said self-time column and to said precharge circuit, wherein said self-time control circuit is configured to enable an access of said RAM cell column in response to said self-time signal.

2. The random access memory array circuit as recited in claim 1 wherein said self-time control circuit is further configured to disable said precharge circuit to thereby cause precharging of said plurality of RAM cells to be discontinued in response to an indication by said self-time signal that said self-time column is charged.

3. The random access memory array circuit as recited in claim 1 further comprising a sense amplifier circuit coupled to said RAM cell column, wherein said sense amplifier circuit is configured to provide an output signal indicative of a storage state of a selected cell, and wherein said sense amplifier is enabled by said self-time control circuit in response to said self-time control circuit sensing a discharged state of said self-time signal.

4. The random access memory array circuit as recited in claim 1 wherein said self-time control circuit is configured to enable said address decode circuit to select said one of said plurality of RAM cells in response to said self-time signal indicating a charged state of said self-time column.

5. The random access memory array circuit as recited in claim 4 wherein said self-time control circuit is configured to cause said self-time column to be discharged at the same time said address decode circuit selects said one of said plurality of RAM cells.

6. The random access memory array circuit as recited in claim 5 further comprising a sense amplifier circuit coupled to said RAM cell column, wherein said sense amplifier circuit is configured to provide an output signal indicative of a storage state of a selected cell, and wherein said sense amplifier is enabled by said self-time control circuit in response to said self-time control circuit sensing a discharged state of said self-time signal.

7. The random access memory array circuit as recited in claim 5 further comprising a write control circuit coupled to said RAM cell column, wherein said write control circuit is configured to invoke a storage of data into a selected RAM cell, and wherein said self-time control circuit is configured to enable said write control circuit to invoke said writing of said data in response to sensing that said self-time signal indicates a discharged state of said self-time column.

8. The random access memory array circuit as recited in claim 1, wherein said self-time control circuit is further configured to disable said precharge circuit in response to said self-time signal indicating a charged state of said self-time column.

9. The random access memory array circuit as recited in claim 1 further comprising a write control circuit coupled to said RAM cell column, wherein said write control circuit is configured to invoke a storage of data into a selected RAM cell, and wherein said self-time control circuit is configured to enable said write control circuit to invoke said writing of said data in response to sensing that said self-time signal indicates a discharged state of said self-time column.

10. The random access memory array circuit as recited in claim 1 wherein said access of said RAM cell column is a memory read access.

11. The random access memory array circuit as recited in claim 1 wherein said access of said RAM cell column is a memory write access.

12. A random access memory array circuit comprising:

a RAM cell column including a plurality of RAM cells;

an address decode circuit coupled to said RAM cell column, wherein said address decode circuit is configured to receive an address signal and to select one of said plurality of RAM cells depending upon said address signal;

a precharge circuit coupled to said RAM cell column for precharging said plurality of RAM cells, wherein said precharge circuit is configured to precharge said plurality of said RAM cells in response to a clock signal;

a self-time column having a delay approximately equal to a delay of said RAM cell column, wherein said self-time column is configured to generate a self-time signal indicative of a charged or discharged state of said self-time column; and a self-time control circuit coupled to said self-time column and to said precharge circuit, wherein said self-time control circuit is configured to enable said address decode circuit to select said one of said plurality of RAM cells in response to said self-time signal indicating said charged state of said self-time column.

13. The random access memory array circuit as recited in claim 12 wherein said self-time control circuit is further configured to disable said precharge circuit to thereby cause precharging of said plurality of RAM cells to be discontinued in response to an indication by said self-time signal that said self-time column is charged.

14. The random access memory array circuit as recited in claim 12 further comprising a sense amplifier circuit coupled to said RAM cell column, wherein said sense amplifier circuit is configured to provide an output signal indicative of a storage state of a selected cell, and wherein said sense amplifier is enabled by said self-time control circuit in response to said self-time control circuit sensing a discharged state of said self-time signal.

15. The random access memory array circuit as recited in claim 12 wherein said self-time control circuit is configured to cause said self-time column to be discharged at the same time said address decode circuit selects said one of said plurality of RAM cells.

16. The random access memory array circuit as recited in claim 15 further comprising a sense amplifier circuit coupled to said RAM cell column, wherein said sense amplifier circuit is configured to provide an output signal indicative of a storage state of a selected cell, and wherein said sense amplifier is enabled by said self-time control circuit in response to said self-time control circuit sensing a discharged state of said self-time signal.

17. The random access memory array circuit as recited in claim 15 further comprising a write control circuit coupled to said RAM cell column, wherein said write control circuit is configured to invoke a storage of data into a selected RAM cell, and wherein said self-time control circuit is configured to enable said write control circuit to invoke said writing of said data in response to sensing that said self-time signal indicates a discharged state of said self-time column.

18. The random access memory array circuit as recited in claim 12, wherein said self-time control circuit is further configured to disable said precharge circuit in response to said self-time signal indicating a charged state of said self-time column.

19. The random access memory array circuit as recited in claim 12 further comprising a write control circuit coupled to said RAM cell column, wherein said write control circuit is configured to invoke a storage of data into a selected RAM cell, and wherein said self-time control circuit is configured to enable said write control circuit to invoke said writing of said data in response to sensing that said self-time signal indicates a discharged state of said self-time column.

20. The random access memory array circuit as recited in claim 12 wherein said self-time control circuit is configured to enable a read access of said RAM cell column in response to said self-time signal indicating said discharged state of said self-time column.

* * * * *